United States Patent [19]

Noda et al.

[11] Patent Number: 5,068,697
[45] Date of Patent: Nov. 26, 1991

[54] SEMICONDUCTOR MEMORY WHICH IS PROTECTED FROM ERASURE BY LIGHT SHIELDS

[75] Inventors: Masanori Noda; Akihiro Nakamura, both of Kanagawa, Japan

[73] Assignee: Sony Corporation, Tokyo, Japan

[21] Appl. No.: 553,374

[22] Filed: Jul. 17, 1990

[30] Foreign Application Priority Data

Jul. 18, 1989 [JP] Japan .................................. 1-186385
Jul. 19, 1989 [JP] Japan .................................. 1-186299
Jul. 29, 1989 [JP] Japan .................................. 1-197829

[51] Int. Cl.$^5$ ..................... H01L 29/68; H01L 29/34; H01L 25/04
[52] U.S. Cl. ................................. 357/23.5; 357/54; 357/84
[58] Field of Search .................... 357/23.5, 84, 54

[56] References Cited

U.S. PATENT DOCUMENTS

| | | | |
|---|---|---|---|
| 3,967,310 | 6/1976 | Horiuchi et al. | 357/54 |
| 4,758,869 | 7/1988 | Eitan et al. | 357/23.5 |
| 4,847,667 | 7/1989 | Mori | 357/23.5 |

FOREIGN PATENT DOCUMENTS 2-79477  3/1990  Japan .................................. 357/23.5

Primary Examiner—Rolf Hille
Assistant Examiner—Robert P. Limanek
Attorney, Agent, or Firm—Hill, Van Santen, Steadman & Simpson

[57] ABSTRACT

A nonvolatile semiconductor memory device having memory cells in which a control gate is stacked on a floating gate through an insulating film. The memory device has redundant memory cells so as to compensate defective memory cells and a transistor to select the redundant memory cells and the redundant memory cells and the transistor to select the redundant memory cells are formed by a nonvolatile memory transistor. The transistor to select the redundant memory cells has a structure in which the upper surface and side walls of the floating gate are covered by a control gate or a structure in which the floating gate and control gate are covered by a light shielding film and an antireflection film formed under the light shielding film.

In a nonvolatile semiconductor memory device having memory cells of a structure in which a control gate is stacked on a floating gate through an insulating film, a phosphosilicate glass film is formed on side walls of the floating gate and the control gate and a silicon nitride film and an arseno-silicate glass film or boro-phosphosilicate glass film are sequentially formed so as to cover the control gate.

5 Claims, 7 Drawing Sheets

SEMICONDUCTOR MEMORY WHICH IS PROTECTED FROM ERASURE BY LIGHT SHIELDS

BACKGROUND OF THE INVENTION

1. Field of the Invention

The present invention relates to a nonvolatile semiconductor memory device and a method of manufacturing the device.

2. Description of Related Art

Hitherto, as one kind of nonvolatile semiconductor memory device, an ultraviolet erasable EPROM (Erasable and Programmable Read Only Memory) has been known which has a capacity that is gradually becoming greater. However, when the capacity of an EPROM increases, defective bits can occur due to problems of manufacturing which, results in the deterioration in the yield of EPROMs. Therefore, for EPROMs which have a large capacity, generally, redundant bits so as to compensate for defective bits and a redundant bit programming circuit so as to select the redundant bits are provided in the memory device, and the defective bits are replaced by redundant bits to compensate for the defective bits. In this case, the redundant bit programming circuit is ordinarily constructed with EPROM memory transistors.

However, when data in the EPROM itself is erased, ultraviolet rays are also irradiated onto the redundant bit programming circuit. Therefore, to prevent the data written in the redundant bit programming circuit from being erased by the irradiation of the ultraviolet rays, it is necessary to take countermeasures so as not to irradiate the ultraviolet rays onto the EPROM memory transistors of the redundant bit programming circuit.

Hitherto, as a countermeasure for such purpose, in general, the upper portion of the EPROM memory transistors for the redundant bit programming circuit has been covered by a first layer of aluminum (Al) film which form wirings so as to thereby shield the upper portion from light.

However, even when the EPROM memory transistors for the redundant bit programming circuit are shielded from light by a first layer of Al film as mentioned above, the following problems still exist. First, since the space between the first layer of Al film and a semiconductor substrate is fairly large, the ultraviolet rays which entered from the portions which are not shielded from the light by the Al film cause a multiple reflection between the surface of the semiconductor substrate and the lower surface of the Al film, so that the ultraviolet rays easily enter the EPROM memory transistors under the Al film. Second, it is necessary to form Al wirings for the source region, drain region, and control gate, and since it is necessary to maintain certain distances between the Al wirings, when the ultraviolet rays are irradiated, the ultraviolet rays enter from the regions between the Al wirings. To prevent this, it is necessary to change the shapes of the source region, drain region, and control gate, so that the area for the EPROM memory transistors for the redundant bit programming circuit becomes large. Moreover, in spite of such a large area structure, it is difficult to sufficiently suppress the irradiation of the ultraviolet rays to the EPROM memory transistors for the redundant bit programming circuit.

On the other hand, as disclosed in Japanese Patent Laid-Open Publication No. Hei 2-79477, the applicant of the present invention has proposed a nonvolatile semiconductor memory device and a manufacturing method in which a phospho-silicate glass (PSG) film containing phosphorus of 1 to 8 weight %, a silicon nitride ($Si_3N_4$) film, and an arseno-silicate glass (AsSG) film or a boro-phospho-silicate glass (BPSG) film are sequentially formed on a floating gate, and by using such a structure, the data retention characteristics of an EPROM or an EEPROM (Electrically Erasable and Programmable Read Only Memory) can be improved.

As mentioned above, by using the three layer structure comprising PSG/$Si_3N_4$/AsSG or PSG/$Si_3N_4$/BPSG as the interlayer insulating film, the data retention characteristics can be improved. However, when the integration density increases and contact holes become small, the following problems result. These problems will be described in detail hereinbelow with reference to FIGS. 1A and 1B.

Figure 1A:
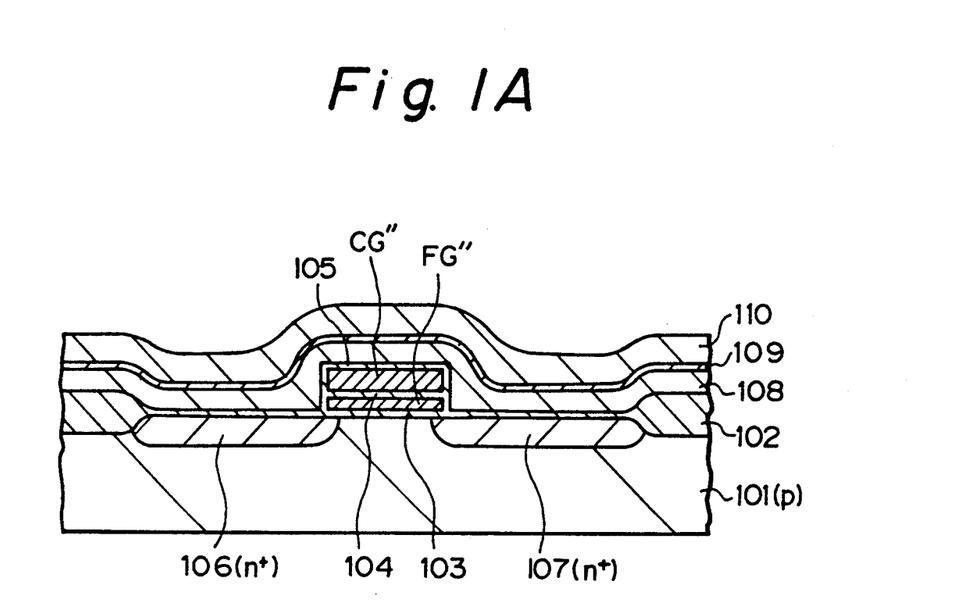
FIGS. 1A and 1B are cross sectional views for explaining a conventional manufacturing method of an EPROM.
Figure 1B:
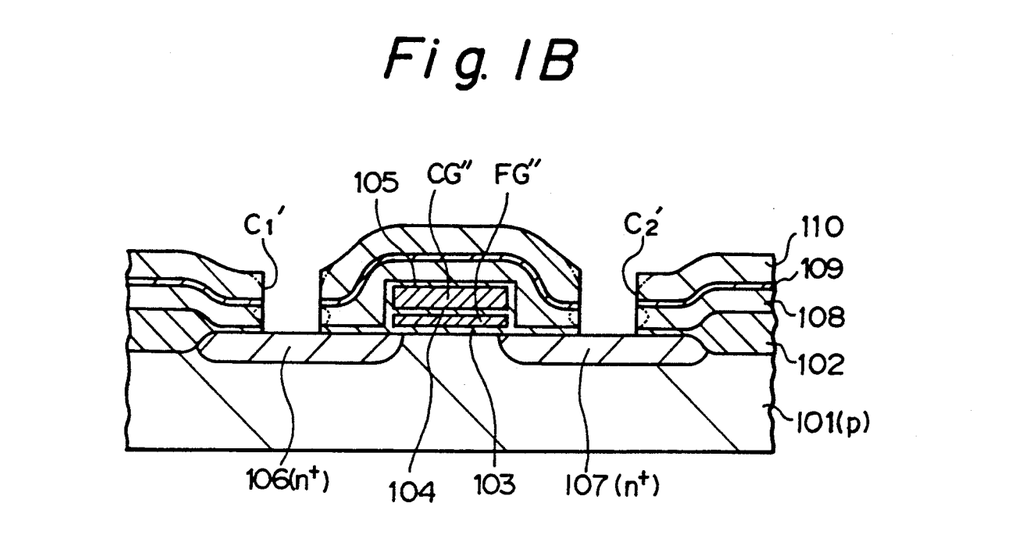

FIGS. 1A and 1B show a conventional manufacturing method of an EPROM.

As shown in FIG. 1A, according to the conventional manufacturing method of an EPROM, a field insulating film 102, a gate insulating film 103, a floating gate FG", a control gate CG", insulating films 104 and 105, and a source region 106 and a drain region 107 of, for instance, an $N^+$-type are formed on a p-type silicon (Si) substrate 101, for example. Then a PSG film 108, an $Si_3N_4$ film 109, and an AsSG film 110 are formed as interlayer insulating films on the whole surface. As already mentioned above, a BPSG film can be also used in place of the AsSG film 110.

Then, a resist pattern (not shown) in which portions corresponding to contact holes to be formed is formed on the AsSG film 110. Then the AsSG film 110, $Si_3N_4$ film 109, PSG film 108, and gate insulating film 103 are sequentially etched by using the resist pattern as mask. Thus, as shown in FIG. 1B, contact holes $C_1'$ and $C_2'$ are formed. Then the resist pattern is removed.

A reflow of the AsSG film 110 is then executed by performing a thermal treatment. Thus, the shoulder portions of the contact holes $C_1'$ and $C_2'$ are set into a smooth round shape as shown by alternate long and short dash lines in FIG. 1B. Then, an Al film and An Al-Si alloy film to form wirings are formed by a sputtering method or an evaporation method. Prior to this as a pre-processing, light etching is first executed by using an etchant of the hydrofluoroic acid (HF) system. Then, after the Al film or Al-Si alloy film has been formed, this film is patterned into a predetermined shape by etching, thereby forming wirings (not shown) which respectively come into contact with the source region 106 and drain region 107 through the contact holes $C_1'$ and $C_2'$.

However, during the above described light etching, the PSG film 108 which is exposed on the inside of the contact holes $C_1'$ and $C_2'$ is also etched into a shape as shown by broken lines in FIG. 1B. Thus, there is a problem such that the shapes of the contact holes $C_1'$ and $C_2'$ after completion of the light etching deteriorate and there is the danger that the shape deterioration results in a cause of a defective contact or the like.

On the other hand, in the EPROM and EEPROM, hitherto both the floating gate and the control gate are formed with an $N^+$-type polycrystalline Si film. In recent years, in accordance with the requirements for realization of large capacity and high speed of the EPROM and EEPROM, as the material of the control gate, it has been necessary to use a low resistivity material such as polycide film in which a silicide film of a refractory metal such as tungsten silicide (WSi$_2$) film, molybdenum silicide (MoSi$_2$) film, or the like is formed on an N+-type polycrystalline Si film, refractory metal film, or the like.

When a thermal oxide film of good quality is formed on the side walls around the floating gate, good data retention characteristics are obtained. However, for this purpose, it is desired to execute the thermal oxidation at a temperature of 1000° C. or higher.

In the EPROM, the EEPROM, or the like having a high integration density, there is generally used a so-called double self-alignment method in which a floating gate and a control gate are formed by simultaneously patterning using one mask. According to the double self-alignment method, the side surfaces of the floating gate in the direction of channel length (direction connecting a source region and a drain region) of a memory transistor are formed so as to be self-aligned with the control gate. Therefore, in the case where the control gate was formed by, for instance, a polycide film, upon thermal oxidation to form an oxide film on the side walls of the floating gate, a refractory metal silicide film such as a WSi$_2$ film or the like is exposed. However, in this state, if the thermal oxidation of a high temperature of, e.g., 1000° C. or higher is executed, there is a large possibility such that refractory metal atoms such as tungsten (W) or the like cause an out-diffusion from the refractory metal silicide film. The refractory metal atoms which caused the out-diffusion are taken into an Si substrate, a thermal oxide film is formed around the floating gate, a thermal oxide film is formed on the Si substrate, and the like, so that a trap level or the like is formed. Such refractory metal atoms easily become a cause of leakage for a cause of breakdown of the oxide film.

For the improvement of the data retention characteristics, the present applicant has proposed in Japanese Patent Laid-Open Publication No. Hei 2-31466 a method whereby by executing a thermal oxidation in a state in which a control gate and a floating gate are covered by a semiconductor layer such as a polycrystalline Si film or the like, a semiconductor oxide film of good film quality is formed on the side walls of the floating gate.

OBJECTS AND SUMMARY OF THE INVENTION

It is, therefore, an object of the invention to provide a nonvolatile semiconductor memory device which can improve the ultraviolet erasure resistance characteristics of a transistor to select redundant memory cells.

It is another object of the invention to provide a nonvolatile semiconductor memory device which has good data retention characteristics and which allows high integration density.

It is still another object of the invention to provide a method of manufacturing a nonvolatile semiconductor memory device by which a nonvolatile semiconductor memory device of good data retention characteristics can be manufactured without causing an out-diffusion of metal atoms included in the control gate upon thermal oxidation to form a semiconductor oxide film on side walls of the floating gate.

According to an aspect of the invention, there is provided a nonvolatile semiconductor memory device having memory cells of a structure in which a control gate is stacked on a floating gate through an insulating film, comprising:

redundant memory cells for compensating defective memory cells; and a transistor to select the redundant memory cells, the redundant memory cells and the transistor to select the redundant memory cells being formed by a nonvolatile memory transistor, and the transistor to select the redundant memory cells having a structure in which the upper surface and side walls of a floating gate are covered by a control gate.

The control gate is formed by a material which does not transmit ultraviolet rays such as a polycrystalline silicon film, a polycide film or the like.

According to another aspect of the invention, there is provided a nonvolatile semiconductor memory device having memory cells of a structure in which a control gate is stacked on a floating gate through an insulating film, comprising:

redundant memory cells for compensating defective memory cells and a transistor to select the redundant memory cells, the redundant memory cells and the transistor to select the redundant memory cells being formed by a nonvolatile memory transistor, and the transistor to select the redundant memory cells having a structure in which a floating gate and a control gate are covered by a light shielding film and an antireflection film being formed under the light shielding film.

For instance, an Al film or an Al-Si alloy film is used as a light shielding film. On the other hand, a polycrystalline Si film, a titanium nitride (TiN) film, an metal silicide film, an amorphous Si film, etc. is used as an antireflection film.

According to still another aspect of the invention, there is provided a nonvolatile semiconductor memory device having memory cells of a structure in which a control gate is stacked on a floating gate through an insulating film, comprising:

a phospho-silicate glass film which is formed on side walls of the floating gate and the control gate; and a silicon nitride film and an arseno-silicate glass film or a boro-phospho-silicate glass film which are sequentially formed so as to cover the control gate.

So as to obtain good data retention characteristics and to prevent deterioration of the moisture resistance, it is preferable to use a phosphor-silicate glass film containing phosphorus of 1 to 8 weight %.

According to a further object of the invention, there is provided a method of manufacturing a nonvolatile semiconductor memory device of a structure in which a control gate is stacked on a floating gate through an insulating film, comprising the steps of:

forming the floating gate made of a semiconductor layer and the control gate made of a layer containing a refractory metal;

covering the floating gate and the control gate by a film which prevents a diffusion of metal atoms and transmits oxygen; and forming a semiconductor oxide film on side walls of at least the floating gate by executing a thermal oxidation.

For the film which prevents the diffusion of metal atoms and transmits oxygen, for instance, it is possible to use an SiO$_2$ film, a PSG film, an AsSG film, a BPSG film, or the like.

For the semiconductor layer constructing the floating gate, for instance, a polycrystalline Si film can be used.

The above, and other, objects, features and advantages of the present invention will become readily apparent from the following detailed description thereof which is to be read in connection with the accompanying drawings.

DETAILED DESCRIPTION OF THE PREFERRED EMBODIMENTS

Embodiments of the invention will be described hereinbelow with reference to the drawings.

Figure 2:
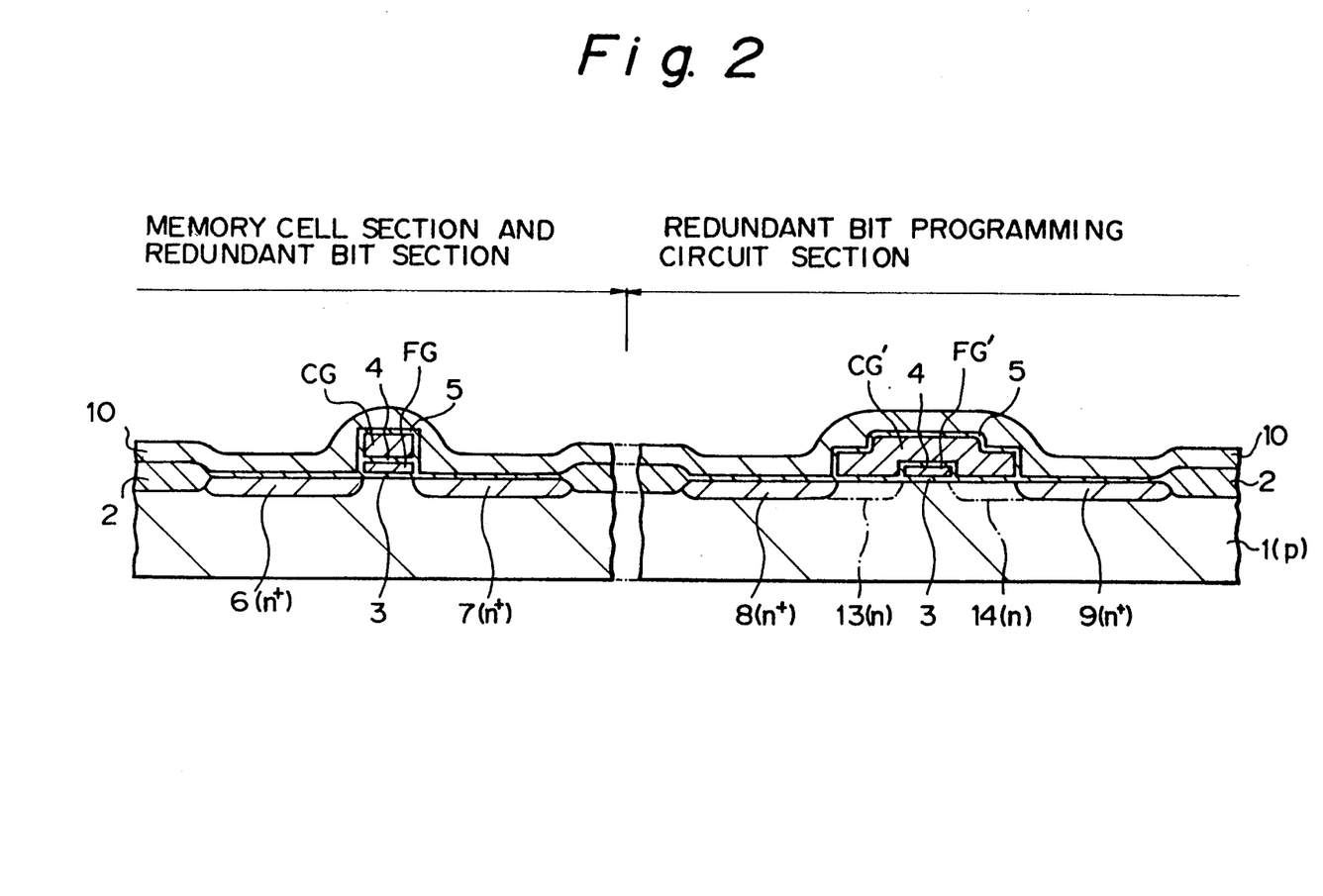
FIG. 2 is a cross sectional view showing an ultraviolet erasable EPROM according to a first embodiment of the invention.

FIG. 2 shows an ultraviolet erasable EPROM according to the first embodiment of the invention.

As shown in FIG. 2, in the ultraviolet erasable EPROM according to the first embodiment, a field insulating film 2 such as an $SiO_2$ film is formed on the surface of a p-type Si substrate 1, for instance, thereby accomplishing isolation between devices. A gate insulating film 3 such as an $SiO_2$ film is formed on the surface of the active region surrounded by the field insulating film 2.

In the memory cell section and in the redundant bit section, a floating gate FG is formed on the gate insulating film 3. The floating gate FG is formed by an $n^+$-type polycrystalline Si film in which impurities such as phosphorus (P) are doped. Reference numeral 4 denotes an insulating film such as a $SiO_2$ film, a $SiO_2$/silicon nitride $(Si_3N_4)SiO_2$ film (ONO film) or a NO film. A control gate CG is stacked on the floating gate FG above the insulating film 4. The control gate CG is formed by, for instance, an $n^+$-type polycrystalline Si film, a polycide film in which a refractory metal silicide film such as a $WSi_2$ film is formed on the $n^+$-type polycrystalline Si film, or the like. On the other hand, in this case, the floating gate FG And control gate CG are formed in a self-aligned manner with respect to the direction of the channel length. Reference numeral 5 shows an insulating film such as an $SiO_2$ film. On the other hand, a source region 6 and a drain region 7 of, for example, $n^+$-type are formed in the p-type Si substrate 1 in a self-aligned manner with respect to the floating gate FG and control gate CG. An EPROM memory transistor is formed by the floating gate FG, control gate CG, source region 6, and drain region 7. A memory cell and a redundant bit (redundant memory cell) are formed by the EPROM memory transistor.

In the redundant bit programming circuit section, a floating gate FG' is formed on the gate insulating film 3. The floating gate FG' is formed by, e.g., an $n^+$-type polycrystalline Si film similarly to the floating gate FG. A control gate CG' is stacked on the floating gate FG' through the insulating film 4. The control gate CG' is formed by an $n^+$-type polycrystalline Si film, a polycide film, or the like which does not transmit ultraviolet rays. In this case, the control gate CG' is formed so as to cover the floating gate FG', so that the upper surface and side walls of the floating gate FG' are covered by the control gate CG'. On the other hand, a source region 8 and a drain region 9 of, for example, the $n^+$-type are formed in the p-type Si substrate 1 in a self-aligned manner with respect to the control gate CG'. An EPROM memory transistor is formed by the floating gate FG', control gate CG', source region 8, and drain region 9. A redundant bit programming circuit is formed by the EPROM memory transistor.

Reference numeral 10 denotes an interlayer insulating film such as a PSG film.

An example of a method of manufacturing the ultraviolet erasable EPROM according to the first embodiment constructed as mentioned above will now be described.

As shown in FIG. 2, after the isolation between devices is executed by forming the field insulating film 2 by selectively thermally oxidizing the surface of the p-type Si substrate 1, the gate insulating film 3 is formed on the surface of the active region which is surrounded by the field insulating film 2 by a thermal oxidation method.

Then, after forming a polycrystalline Si film which forms the floating gate over the whole surface by, e.g., a CVD method, n-type impurities such as P are doped onto the polycrystalline Si film at a high concentration, thereby forming an $n^+$-type polycrystalline Si film. After that the $n^+$-type polycrystalline Si film is patterned by etching. In the memory cell section and in the redundant bit section, the $n^+$-type polycrystalline Si film is set to a predetermined width in the direction perpendicular to a cross section shown in FIG. 2. In the redundant bit programming circuit section, the $n^+$-type polycrystalline Si film is patterned like an island. Then the insulating film 4 is formed on the $n^+$-type polycrystalline Si film by, e.g., the thermal oxidation method.

Subsequently, then a polycrystalline Si film so as to form the control gate is formed onto the whole surface by, e.g., the CVD method, n-type impurities are doped into the polycrystalline Si film in a manner similar to the above described method thereby forming an $n^+$-type polycrystalline Si film. Then a resist pattern (not shown) of the shape corresponding to the control gate CG is formed on the $n^+$-type polycrystalline Si film in the memory cell section and in the redundant bit section. On the other hand, a resist pattern (not shown) of the shape corresponding to the control gate CG' is formed on the $n^+$-type polycrystalline Si film in the redundant bit programming circuit section. Then, by using those resist patterns as masks, the $n^+$-type polycrystalline Si film to form the control gate, the insulating film 4, and the $n^+$-type polycrystalline Si film to form the floating gate are anisotropically etched in the direction perpendicular to the surface of the substrate by, e.g., a reactive ion etching (RIE) method. Due to this, as shown in FIG. 2, in the memory cell section and redundant bit section, the floating gate FG and control gate CG have the same width and are formed in a self-aligned manner. On the other hand, in the redundant bit programming circuit section, the control gate CG' which has a larger width than the floating gate FG' is formed. Then, after the resist patterns are removed, the insulating film 5 is formed by, e.g., the thermal oxidation method.

Subsequently, by using the control gates CG and CG' and the floating gates FG as masks, n-type impurities such as arsenic (As) are ion implanted into the p-type Si substrate 1 at a high concentration. Due to this, in the memory cell section and in the redundant bit section, the $n^+$-type source region 6 and drain region 7 are formed in the p-type Si substrate 1 in a self-aligned manner with respect to the floating gate FG and control gate CG. On the other hand, in the redundant bit programming circuit section, the $n^+$-type source region 8 and drain region 9 are formed in the p-type Si substrate 1 in a self-aligned manner with respect to the control gate CG'. Then, the interlayer insulating film 10 is formed on the whole surface by, e.g., the CVD method. Then, an objective EPROM is completed using steps of forming contact holes and Al wirings (not shown) and the like.

As mentioned above, according to the first embodiment, since the memory has a structure in which the floating gate FG' of the EPROM memory transistor which forms the redundant bit programming circuit is covered by the control gate CG' made of a material which does not transmit ultraviolet rays, when ultraviolet rays are irradiated to the EPROM to erase data in the memory cell section, in the redundant bit programming circuit, the ultraviolet rays will be prevented from irradiating the floating gate FG' due to the control gate CG'. Thus, the ultraviolet erasure resistance characteristics of the redundant bit programming circuit are improved and it is possible to prevent data in the redundant bit programming circuit from being erased by irradiation of the ultraviolet rays.

On the other hand, the memory cells and redundant bits (redundant memory cells) are constructed by the EPROM memory transistors in a small area. Therefore, in the memory cell section and redundant bit section, the EPROM memory transistors can be formed at a high integration density and the write/erase characteristics are good. On the other hand, the area of EPROM memory transistor of the redundant bit programming circuit section increases by an amount corresponding to the increased area of the control gate CG' and the write characteristics are also inferior to those of the EPROM memory transistors in the memory cell section and in the redundant bit section. However, since the number of EPROM memory transistors in the redundant bit programming circuit section is ordinarily so small so as to be about ten to a hundred and the programming is executed on a tester, such drawbacks actually do not cause any problems.

As shown in FIG. 2, in the above first embodiment, it is also possible to use a structure in which semiconductor regions 13 and 14 of low impurity concentrations of, for example, n-type are formed between the source region 8 and the floating gate FG' and between the drawing region 9 and the floating gate FG', respectively.

Figure 3:
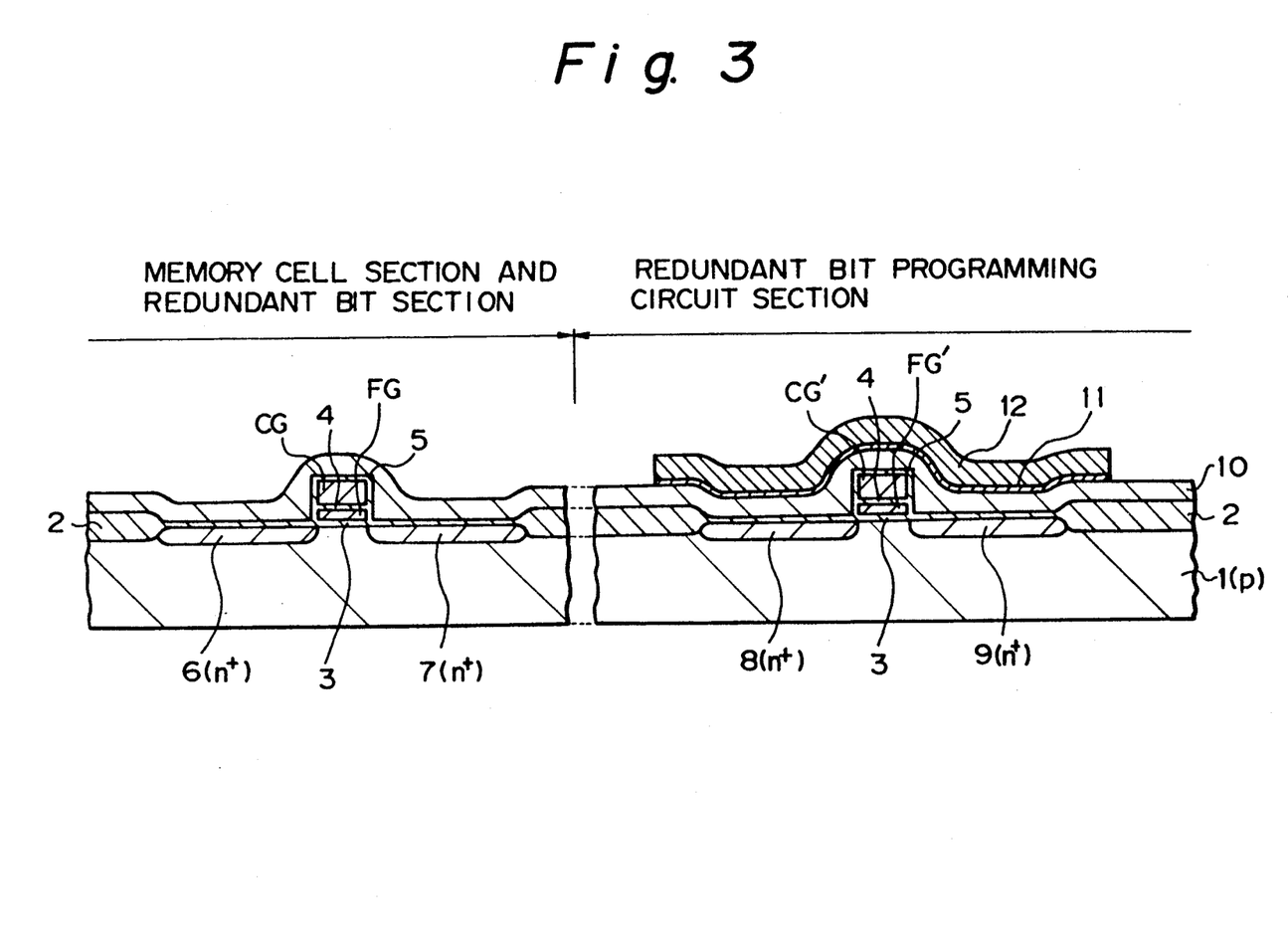
FIG. 3 is a cross sectional view showing an ultraviolet erasable EPROM according to a second embodiment of the invention.

FIG. 3 shows an ultraviolet erasable EPROM according to the second embodiment of the invention. In FIG. 3, the same portions as FIG. 2 are designated by the same reference numerals.

As shown in FIG. 3, in the ultraviolet erasable EPROM according to the second embodiment, all of the memory cell section, the redundant bit section, and the redundant bit programming circuit section are constructed by EPROM memory transistors with a construction similar to the EPROM memory transistors which form the memory cell section and the redundant bit section of the ultraviolet erasable EPROM according to the first embodiment.

In the second embodiment, an antireflection film 11 and an AL film 12 which is a light shielding film are formed on the interlayer insulating film 10 so as to cover the whole EPROM memory transistor of the redundant bit programming circuit section. The antireflection film 11 is formed by a material having a low reflectance such as a polycrystalline Si film or a TiN film.

An example of a method of manufacturing the ultraviolet erasable EPROM according to the second embodiment constructed as mentioned above will now be described.

As shown in FIG. 3, the field insulating film 2, the gate insulating film 3, the floating gates FG and FG', the insulating film 4, the control gates CG and CG', the insulating film 5, and the interlayer insulating film 10 are formed by a method which is substantially similar to that in the first embodiment. Then, for example, a polycrystalline Si film or a TiN film is formed on the whole surface by, e.g., the CVD method or the sputtering method. Further, after an Al film is formed thereon, those films are patterned in a predetermined shape by etching, thereby forming the antireflection film 11 and the Al film 12 as a light shielding film.

According to the second embodiment, since the memory has a structure in which the EPROM memory transistor of the redundant bit programming circuit section is completely covered by the antireflection film 11 and Al film 12, when ultraviolet rays are irradiated to erase data in the memory cells, the ultraviolet rays which directly enter the Al film 12 are obviously light shielded by the Al film 12. It is also possible to prevent in the following manner the EPROM memory transistor from being irradiated by the ultraviolet rays which entered the portions which are not covered by the Al film 12. That is, even if the ultraviolet rays entered the surface of the p-type Si substrate 1 from the portions which are not light shielded by the Al film 12 and reflected lights is caused thereby, when the reflected lights enter the antireflection film 11, its intensity is attenuated. Such a light attenuation is equivalent to that of the reflectance of the lower surface of the AL film 12 as a light shielding film which effectively decreases. Therefore, the multiple reflection between the surface of the p-type Si substrate 1 and the lower surface of the Al film 12 is effectively suppressed, so that it is possible to prevent the ultraviolet rays from irradiating the floating gate FG' of the EPROM memory transistor of the redundant bit programming circuit section. Thus, the ultraviolet erasure resistance characteristics of the redundant bit programming circuit section are improved and the erasure of data in the redundant bit programming circuit section can be prevented.

On the other hand, when considering the fact that the multiple reflection of the ultraviolet rays between the surface of the p-type Si substrate 1 and the Al film 12 is suppressed as mentioned, it means that the area of Al film 12 which is the light shielding film can be reduced as compared with that in the conventional method from another viewpoint. Therefore, the area of EPROM memory transistor of the redundant bit programming circuit section can be reduced.

Figure 4:
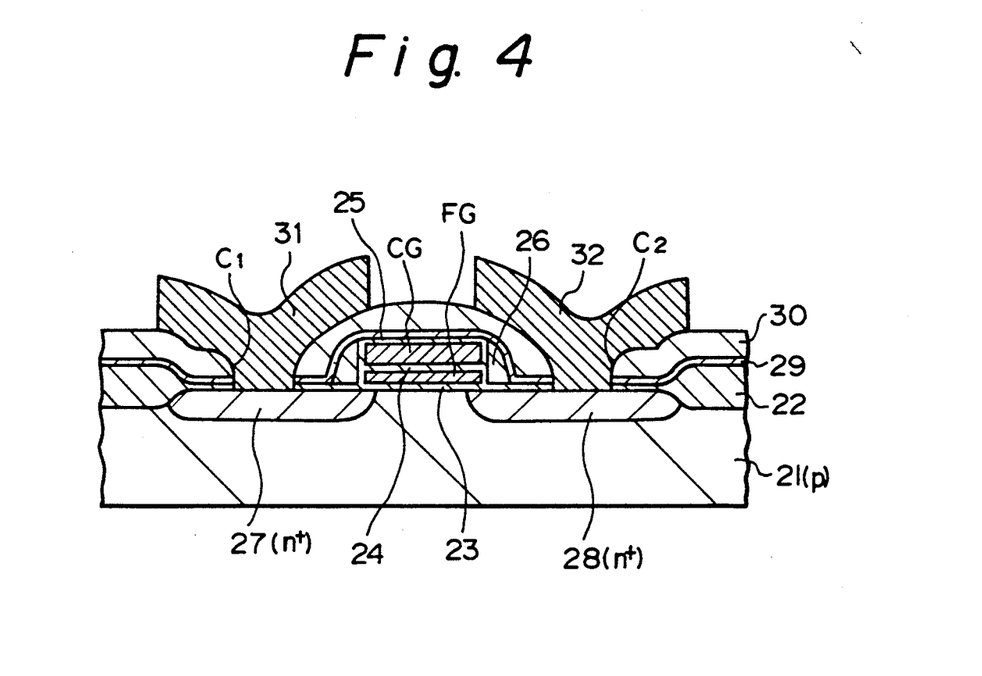
FIG. 4 is a cross sectional view showing an EPROM according to a third embodiment of the invention.

FIG. 4 shows an EPROM according to the third embodiment of the invention.

As shown in FIG. 4, in the EPROM according to the third embodiment, a field insulating film 22 such as an $SiO_2$ film is formed on the surface of a p-type Si substrate 21, for instance, so as to thereby accomplish isolation between devices. A gate insulating film 23 such as an $SiO_2$ film is formed on the surface of an active region surrounded by the field insulating film 22. A floating gate FG made of an $N^+$-type polycrystalline Si film in which impurities such as P are doped is formed on the gate insulating film 23. A control gate CG is stacked over the floating gate FG through an insulating film 24 such as an $SiO_2$ film, an ONO film, or an NO film. The control gate CG can be formed by, for instance, an $n^+$-type polycrystalline Si film, a polycide film, or the like.

Further, an insulating film 25 such as an $SiO_2$ film is formed on the upper surface of the control gate CG and on the side walls of the floating gate FG and control gate CG.

In the third embodiment, a PSG film 26 is formed on the side walls of the floating gate FG and control gate CG. Here, a concentration of phosphorus in the PSG film 26 is preferably set to 1 to 8 weight %. On the other hand, the thickness of PSG film 26 is set to, for instance, about 2000 Å.

A source region 27 and a drain region 28 of, for example, an $n^+$-type are formed in the p-type Si substrate 21 in a self-aligned manner with respect to the floating gate FG and the control gate CG. A memory transistor is formed by the floating gate FG, the control gate CG, the source region 27, and the drain region 28.

Reference numeral 29 denotes an $Si_3N_4$ film having a thickness of, for instance, about 500Å. Reference numeral 30 indicates an AsSG film having a thickness of, e.g., about 6000Å. An interlayer insulating film is constructed by the PSG film 26, $Si_3N_4$ film 29, and AsSG film 30.

$C_1$ and $C_2$ represent contact holes. Wirings 31 and 32 made of, for instance, Al or an Al-Si alloy are in contact with the source region 27 and drain region 28 through the contact holes $C_1$ and $C_2$, respectively.

An example of a method of manufacturing the EPROM according to the third embodiment with the above construction will now be described with reference to FIGS. 5A to 5C.

Figure 5A:
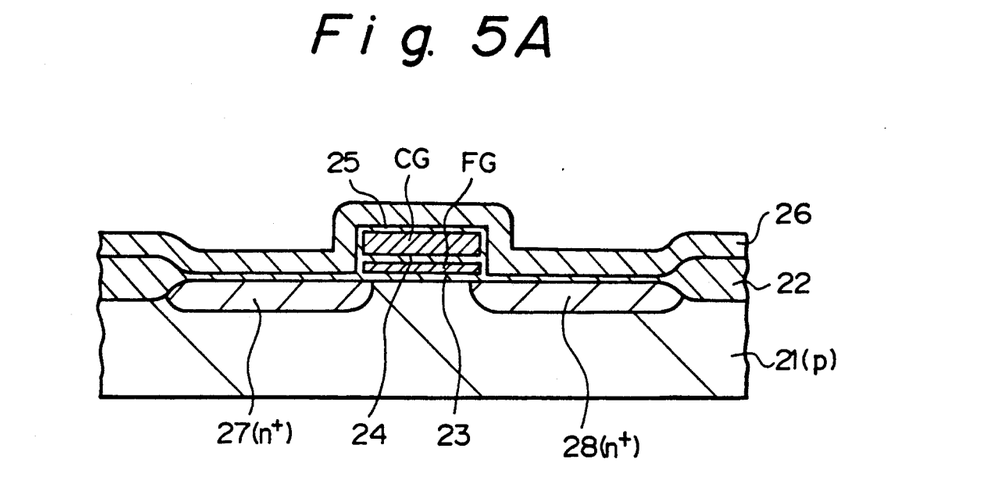
FIGS. 5A to 5C are cross sectional views for explaining an example of a method of manufacturing an EPROM shown in FIG. 4.

As shown in FIG. 5A, after the isolation between devices is executed by forming the field insulating film 22 by selectively thermally oxidizing the surface of the p-type Si substrate 21, the gate insulating film 23 is formed on the surface of the active region surrounded by the field insulating film 22. Then, after a polycrystalline Si film which forms the floating gate is formed on the whole surface by, for instance, a CVD method, n-type impurities such as P are doped into the polycrystalline Si film at a high concentration, thereby forming an $n^+$-type polycrystalline Si film. Subsequently, the $n^+$-type polycrystalline Si film is patterned by etching so that it has a predetermined width in the direction perpendicular to the cross section shown in FIG. 5A. Then, the insulating film 24 such as an $SiO_2$ film is formed on the $n^+$-type polycrystalline Si film by, e.g., a thermal oxidation method. A polycrystalline Si film to form the control gate is formed on the whole surface by, for instance, the CVD method. Then n-type impurities such as P are doped into the polycrystalline Si film at a high concentration, thereby forming an $n^+$-type polycrystalline Si film. Next, a resist pattern (not shown) having a shape corresponding to the control gate CG to be formed is formed by a lithography onto the $n^+$-type polycrystalline Si film to form the control gate. In accordance with the double self-aligned method, by using the resist pattern as a mask, the $n^+$-type polycrystalline Si film to form the control gate and the $n^+$-type polycrystalline Si film to form the floating gate are sequentially anisotropically etched in the direction perpendicular to the surface of the substrate by, for example, the RIE method, thereby simultaneously forming the floating gate FG and the control gate CG. Due to this, the floating gate FG and the control gate CG are formed in a self-aligned manner. Then, for instance, by using the resist pattern as a mask, n-type impurities such as arsenic As are ion implanted into the p-type Si substrate 21 at a high concentration, thereby forming the source region 27 and drain region 28 of, for example, the $n^+$-type in a self-aligned manner with respect to the floating gate FG and control gate CG. After that, the resist pattern is removed. The source region 27 and drain region 28 can be also formed by executing the ion implantation by using the control gate CG and floating gate FG as masks after the resist pattern is removed. The insulating film 25 is then formed on the upper surface of the control gate CG and on the side walls of the floating gate FG and the control gate CG by, e.g., a thermal oxidation method. After that, the PSG film 26 is formed on the whole surface by, e.g., the CVD method.

Figure 5B:
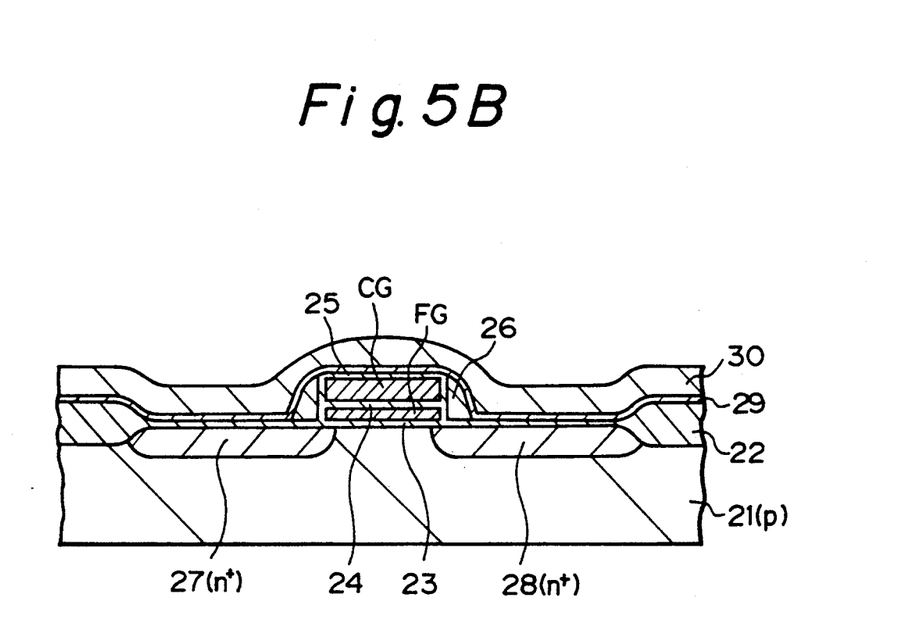
Figure 5C:
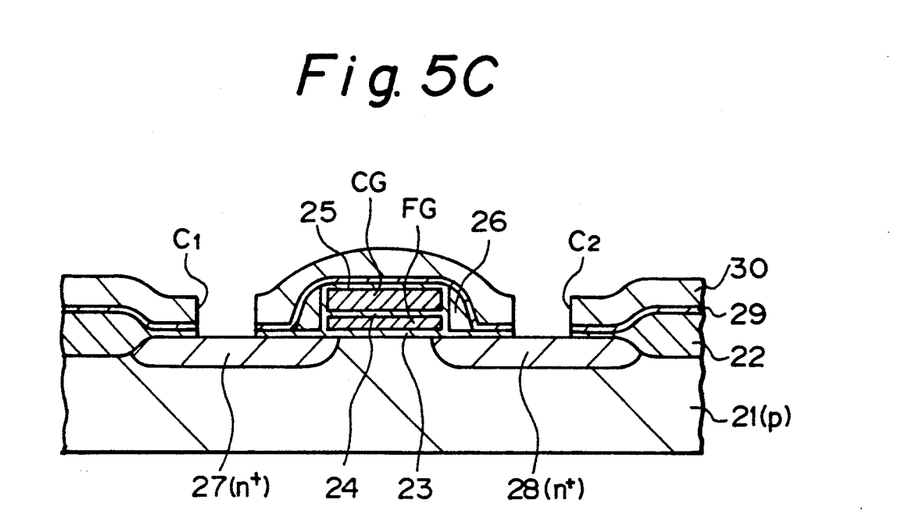

Then, by anisotropically etching the PSG film 26 in the direction perpendicular to the substrate surface by, e.g., the RIE method, as shown in FIG. 5B, the PSG film 26 is left only on the side walls of the floating gate FG and the control gate CG. Then, the $Si_3N_4$ film 29 and the AsSG film 30 are formed on the whole surface by, e.g., the CVD method.

Then, a resist pattern (not shown) in which the portions corresponding to the contract holes $C_1$ and $C_2$ to be formed are opened is formed on the AsSG film 30. The AsSG film 30, the $Si_3N_4$ film 29, and the gate insulating film 23 are sequentially etched by using the resist pattern as a mask. Thus, as shown in FIG. 5C, the contact holes $C_1$ and $C_2$ are formed on the source region 27 and drain region 28 at the locations away from the PSG film 26, respectively.

Then, the reflow of the AsSG film 30 is performed by executing a thermal treatment at a temperature of, e.g., about 850° C. Due to this, the shoulder portions of the contact holes $C_1$ and $C_2$ are set into a round smooth shape (refer to FIG. 4). Then, light etching is executed by an etchant of the HF system as a pre-processing of formation of the Al film or Al-Si alloy film to form the wirings. In this case, as will be obvious from FIG. 5C, since the PSG film 26 is never exposed to the inner portions of the contact holes $C_1$ and $C_2$, the PSG film 26 will not be etched by light etching. Subsequently, for instance, after the Al film, Al-Si alloy film, or the like is formed on the whole surface by, e.g., a sputtering method or an evaporation method, the film is patterned into a predetermined shape by etching, thereby forming the wirings 31 and 32 as shown in FIG. 4 and completing an objective EPROM.

According to the third embodiment, since the PSG film 26 is formed only on the side walls of the floating gate FG and the control gate CG and the PSG film 26 is never exposed on the inner portions of the contact holes $C_1$ and $C_2$, a problem is eliminated in that the PSG film 26 is not etched during light etching by the HF system etchant which is executed before the formation of the Al film, the Al-Si alloy film, or the like after the contact holes $C_1$ and $C_2$ are formed. Therefore, even if the contact holes $C_1$ and $C_2$ become small in association with the realization of a high integration density of the EPROM, there is no danger that the shapes of the contact holes $C_1$ and $C_2$ will deteriorate due to light etching. On the other hand, when seen from the side of the floating gate FG, since the interlayer insulating film has a three-layer structure comprising the PSG film 26, the $Si_3N_4$ film 29, and the AsSG film 30, good data retention characteristics can be obtained as already mentioned above.

Accordingly, it is possible to realize an EPROM which has good data retention characteristics and can also have a high integration density.

The EPROM according to the third embodiment can be applied to, for example, an OTP (One Time Programmable) one-chip microcomputer or the like.

In the third embodiment, a BPSG film can be also used in place of, e.g., the AsSG film 30. The memory transistor can be also set to what is called an LDD (Lightly Doped Drain) structures. Further, it is also possible to use a structure in which another film such as an $SiO_2$ film is interposed between the PSG film 26 and the $Si_3N_4$ film 29 and between the $Si_3N_4$ film 29 and the AsSG film 30.

FIGS. 6A to 6F show a manufacturing method of an EPROM according to the fourth embodiment of the invention.

Figure 6A:
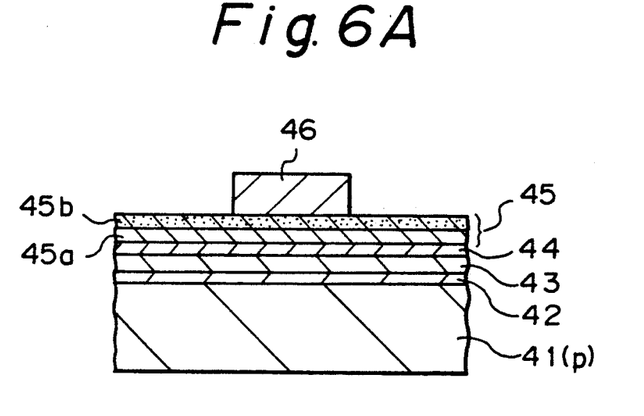
FIGS. 6A to 6F are cross sectional views for explaining a method of manufacturing an EPROM according to a fourth embodiment of the invention.

In the fourth embodiment, as shown in FIG. 6A, a gate insulating film 42 such as an $SiO_2$ film, a polycrystalline Si film 43 of, for instance, an $n^+$-type to form a floating gate, an insulating film 44 such as an $SiO_2$ film, and a polycide film 45 to form a control gate are formed on, for instance, a p-type Si substrate 41 in which a field insulating film (not shown) is formed and the isolation between devices has previously been executed. A resist pattern 46 of a predetermined shape is formed on the polycide film 45 by lithography. The polycide film 45 comprises: for instance, an $n^+$-type polycrystalline Si film 45a in which impurities such as P are doped; and a refractory metal silicide film 45b such as a $WSi_2$ film or a $MoSi$, film formed on the film 45a. In the state shown in FIG. 6A, it is assumed that the polycrystalline Si film 43 to form the floating gate has already been patterned with respect to the direction perpendicular to the cross section shown in FIG. 6A.

Figure 6B:
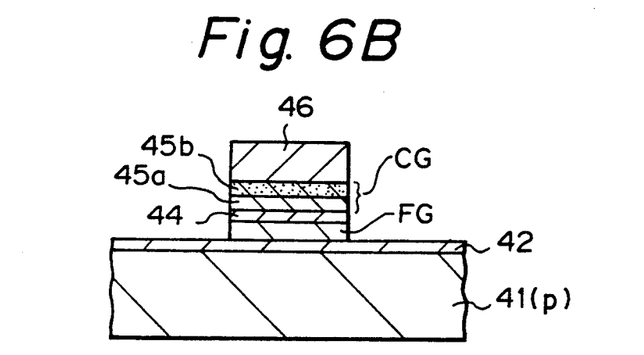

Then, in accordance with the double self-aligned method, the polycide film 45, the insulating film 44, and the polycrystalline Si film 43 are anisotropically etched in the direction perpendicular to the surface of the substrate by, for instance, the RIE method by using the resist pattern 46 as a mask. Thus, as shown in FIG. 6B, a floating gate FG and a control gate CG are formed in a self-aligned manner.

Figure 6C:
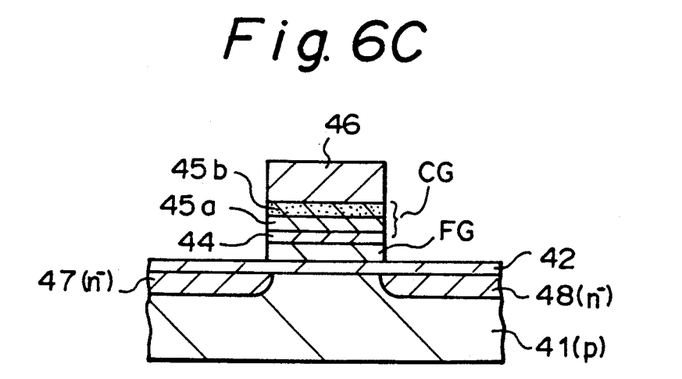

Then, as shown in FIG. 6C, by using the resist pattern 46 as a mask, n-type impurities such as P are ion implanted into the p-type Si substrate 41 at a low concentration. Thus, for example, n-type semiconductor regions 47 and 48 of low impurity concentrations are formed in a self-aligned manner with respect to the floating gate FG and control gate CG.

Figure 6D:
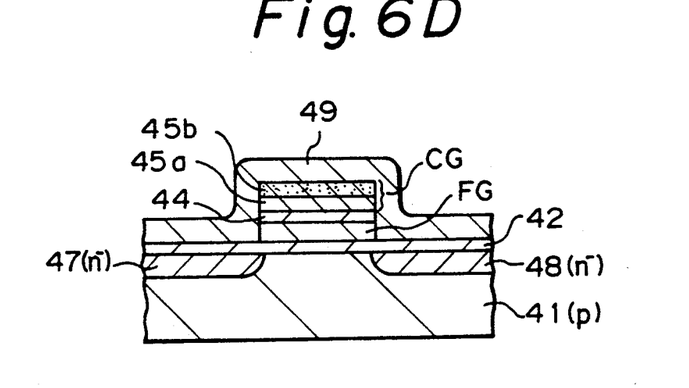

As shown in FIG. 6D, for instance, an $SiO_2$ film 49 is then formed on the whole surface by, e.g., the CVD method as a cap layer which prevents the diffusion of metal atoms and transmits oxygen ($O_2$). The floating gate FG and control gate CG are completely covered by the $SiO_2$ film 49. For example, by using an atmospheric pressure CVD method, the $SiO_2$ film 49 can be formed at a low temperature of, for instance, about 400° C.

Figure 6E:
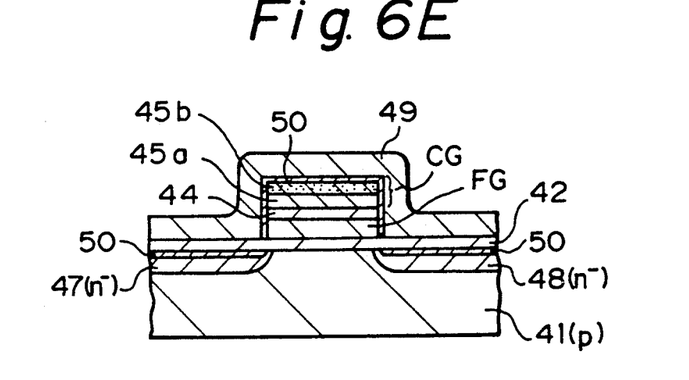

A thermal oxidation at a high temperature of, for instance, about 1000° C. or higher is executed in a state in which the floating gate FG and control gate CG are covered by the $SiO_2$ film 49 as mentioned above. Thus, as shown in FIG. 6E, an $SiO_2$ film 50 is formed by the thermal oxidation method on the side walls of the floating gate FG and the control gate CG which are in contact with the $SiO_2$ film 49. A thickness of $SiO_2$ film 50 is set to, e.g., about 50 to 100Å. Upon such a thermal oxidation, since the side surface of the control gate CG made of a polycide film is covered by the $SiO_2$ film 49, it is prevented that refractory metal atoms such as W are diffused out from the refractory metal silicide film 45b which forms the control gate CG upon thermal oxidation. The SiO2 film 50 is also formed on the surface of the p-type Si substrate 41 in the portions on both sides of the floating gate FG by the thermal oxidation.

Figure 6F:
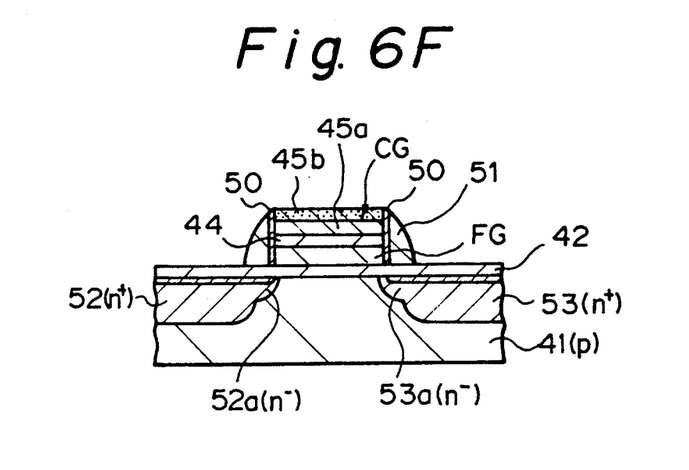

Then, by anisotropically etching the $SiO_2$ film 49 in the direction perpendicular to the substrate surface by, e.g. the RIE method, as shown in FIG. 6F, a side wall spacer 51 made of $SiO_2$ is formed. Subsequently, by using the side wall spacer 51 as a mask, n-type impurities such as arsenic As are ion implanted into the p-type Si substrate 41 at a high concentration. Thus, a source region 52 and a drain region 53 of, for example, the $n^+$-type having n-type low impurity concentration portions 52a and 53a are formed into the p-type Si substrate 41 in the lower portion of the side wall spacer 51 in a self-aligned manner with respect to the floating gate FG and the control gate CG. Here, the low impurity concentration portions 52a and 53a are formed by parts of the semiconductor regions 47 and 48 of the low impurity concentrations which have already been formed. A memory transistor comprising the floating gate FG, control gate CG, source region 52, and drain region 53 has an LDD structure in which the electric field near the drain region 53 is reduced by the low impurity concentration portion 53a.

According to the fourth embodiment, by executing a thermal oxidation in a state in which the control gate CG made of the polycide film 45 and the floating gate FG are covered by the $SiO_2$ film 49, the $SiO_2$ film 50 is formed on the side walls of the floating gate FG and the control gate CG. Therefore, the out-diffusion of the refractory metal atoms from the refractory metal silicide film 45b constructing the control gate CG upon thermal oxidation can be prevented. Due to this, it is possible to solve the problems such as formation of the trap level which is caused because the out-diffused refractory metal atoms are taken into the p-type Si substrate 41, $SiO_2$ film 50 formed around the floating gate FG, gate insulating film 42, etc. and a breakdown of the $SiO_2$ film 50, gate insulating film 42, and the like. On the other hand, since the out-diffusion of the refractory metal atoms can be prevented as mentioned above, the thermal oxidation can be executed at a higher temperature. Moreover, since the thermal oxidation is performed through the $SiO_2$ film 49, the thermal oxidation is stably performed at a relatively slow speed. Thus, the SiO₂ film 50 of good film quality can be formed on the side walls of the floating gate FG, so that an EPROM of good data retention characteristics can be manufactured.

In the fourth embodiment, a refractory metal film can be also used as a material to form the control gate CG. On the other hand, although the fourth embodiment has been described above with respect to the case where the memory transistor has an LDD structure, the memory transistor does not always need to have the LDD structure.

Having described specific preferred embodiments of the present invention with reference to the accompanying drawings, it is to be understood that the invention is not limited to these precise embodiments, and that various changes and modifications may be effected therein by one skilled in the art without departing from the scope or the spirit of the invention as defined in the appended claims.

For instance, although the above embodiments have been described with respect to the case where the invention was applied to an EPROM, the invention can be applied to an EEPROM and other various kinds of floating gate memory devices.

According to the invention, since the incidence of the ultraviolet rays on the floating gate can be prevented by the control gate which covers the upper surface and side walls of the floating gate, the ultraviolet erasable resistance characteristics of the nonvolatile memory transistor to select the redundant memory cells can be improved.

According to the invention, since the multiple reflection of the ultraviolet rays between the surface of the semiconductor substrate and the light shielding film can be suppressed by the antireflection film formed under the light shielding film, the ultraviolet erasure resistance characteristics of the nonvolatile memory transistor to select the redundant memory cells can be improved.

According to the invention, the phospho-silicate glass film is formed on the side walls of the floating gate and control gate and the silicon nitride film and the arsenosilicate glass film or boro-phospho-silicate glass film are sequentially formed so as to cover the control gate. Therefore, the shapes of the contact holes are not deteriorated by the light etching which is executed as a preprocessing of the formation of the film to form the wirings. Thus, it is possible to realize a nonvolatile semiconductor memory device which has good data retention characteristics and can also cope with the realization of a high integration density.

According to the invention, since the thermal oxidation is executed in a state in which the floating gate and the control gate were covered by the film which prevents the diffusion of the metal atoms and transmits oxygen, upon thermal oxidation to form the semiconductor oxide film on the side walls of the floating gate, the out-diffusion of the metal atoms contained in the control gate does not occur, and a nonvolatile semiconductor memory device of good data retention characteristics can be manufactured.

We claim as our invention:

1. A nonvolatile semiconductor memory device having memory cells in which a control gate is stacked on a floating gate through an insulating film, comprising:
   p1 a plurality of redundant memory cells for compensating defective memory cells; and
   a transistor for selecting said redundant memory cells,
   said redundant memory cells and said transistor for selecting said redundant memory cells formed by a nonvolatile memory transistor, and said transistor for selecting sad redundant memory cells having a structure in which a floating gate and a control gate are covered by an anti-reflection film which extends substantially beyond said floating and said control gates and a light shielding film formed over said light shielding film.

2. A nonvolatile semiconductor memory device according to claim 1, wherein said light shielding film is formed of an aluminum film or an aluminum alloy film.

3. A nonvolatile semiconductor memory device according to claims 1 or 2, wherein said antireflection film is formed of a polycrystalline silicon film, a titanium nitride film, a metal silicide film, or an amorphous silicon film.

4. A nonvolatile semiconductor memory device having memory cells in which a control gate is stacked on a floating gate with an insulating film, between them comprising:
   a tapered phospho-silicate glass film is formed on the side walls of said floating gate and said control gate; and
   a silicon nitride film and an arseno-silicate glass film or a boro-phospho-silicate glass film sequentially formed so as to cover said control gate.

5. A nonvolatile semiconductor memory device according to claim 4, wherein contact holes for a source region and a drain region of a nonvolatile memory transistor are formed at locations which are spaced from said phospho-silicate glass film.

* * * * *